(12) United States Patent
Imai

(10) Patent No.: US 9,293,662 B2
(45) Date of Patent: Mar. 22, 2016

(54) LIGHT EMITTING DEVICE COMPRISING CHIP-ON-BOARD PACKAGE SUBSTRATE AND METHOD FOR MANUFACTURING

(71) Applicant: Yuji Imai, Tokyo (JP)

(72) Inventor: Yuji Imai, Tokyo (JP)

(73) Assignee: DE L ASSOCIATES INC., Osaka-Shi, Osaka (JP)

( * ) Notice: Subject to any disclaimer, the term of this patent is extended or adjusted under 35 U.S.C. 154(b) by 0 days.

(21) Appl. No.: 14/402,842

(22) PCT Filed: May 17, 2013

(86) PCT No.: PCT/JP2013/063860
§ 371 (c)(1),
(2) Date: Nov. 21, 2014

(87) PCT Pub. No.: WO2013/176062
PCT Pub. Date: Nov. 28, 2013

(65) Prior Publication Data
US 2015/0097201 A1    Apr. 9, 2015

(30) Foreign Application Priority Data

May 21, 2012 (JP) ................. 2012-115918

(51) Int. Cl.
| | | |
|---|---|---|
| *H01L 29/20* | (2006.01) | |
| *H01L 33/48* | (2010.01) | |
| *F21K 99/00* | (2010.01) | |
| *H01L 27/15* | (2006.01) | |

(Continued)

(52) U.S. Cl.
CPC ............. *H01L 33/486* (2013.01); *F21K 9/135* (2013.01); *H01L 27/15* (2013.01); *H01L 33/50* (2013.01);

(Continued)

(58) Field of Classification Search
CPC .......... H01L 2224/48091; H01L 2924/00014; H01L 2224/16; H01L 2224/48; H01L 2224/48227; H01L 25/0753; H01L 27/15; H01L 33/0079; H01L 33/486; H01L 33/50; H01L 33/62; F21K 9/135; F21V 3/00; F21Y 2101/02; F21Y 2105/003; F21Y 2113/005
USPC ........ 257/89; 362/84; 313/503, 487; 315/363
See application file for complete search history.

(56) References Cited

U.S. PATENT DOCUMENTS

| | | |
|---|---|---|
| 5,851,063 A | 12/1998 | Doughty et al. |
| 2005/0156496 A1 | 7/2005 | Takashima et al. |

(Continued)

FOREIGN PATENT DOCUMENTS

| | | | |
|---|---|---|---|
| JP | 10-209504 A | 8/1998 | |
| JP | 2001-352104 A | 12/2001 | |

(Continued)

OTHER PUBLICATIONS

International Search Report (ISR) (PCT Form PCT/ISA/210), in PCT/JP2013/063860, dated Jun. 18, 2013.

*Primary Examiner* — Mohammed Shamsuzzaman
(74) *Attorney, Agent, or Firm* — McGinn IP Law Group PLLC

(57) ABSTRACT

[Problem] To provide a chip-on-board light emitting device and a method for manufacturing the same such that even though the light emitting device is a chip-on-board light emitting device, it is possible to improve color rendering thereof without excessively reducing the amount of light emission and without installing special circuit patterns or performing current control. [Solution] A chip-on-board light emitting device in which a plurality of LED elements are mounted directly on a package substrate includes a circuit pattern formed on the package substrate, the circuit pattern including a plurality of mounting sections on which the plurality of LED elements are mounted and an anode electrode and cathode electrode pair. The LED elements mounted on the circuit pattern include a plurality of types of LED elements having different emission wavelengths and temperature characteristics, so that by utilizing the temperature characteristics of the plurality of types of LED elements, the device as a whole has a greater average color rendering index (Ra) at an operating temperature than at a ordinary temperature.

4 Claims, 16 Drawing Sheets

(51) Int. Cl.
  *H01L 33/50* (2010.01)
  *H01L 33/62* (2010.01)
  *H01L 25/075* (2006.01)
  *F21V 3/00* (2015.01)
  *F21Y 101/02* (2006.01)
  *F21Y 105/00* (2006.01)
  *F21Y 113/00* (2006.01)
  *H01L 33/00* (2010.01)

(52) U.S. Cl.
  CPC . *H01L 33/62* (2013.01); *F21V 3/00* (2013.01); *F21Y 2101/02* (2013.01); *F21Y 2105/003* (2013.01); *F21Y 2113/005* (2013.01); *H01L 25/0753* (2013.01); *H01L 33/0079* (2013.01); *H01L 2224/14* (2013.01); *H01L 2224/16* (2013.01); *H01L 2224/48091* (2013.01); *H01L 2224/48227* (2013.01)

(56) References Cited

U.S. PATENT DOCUMENTS

| | | | |
|---|---|---|---|
| 2006/0197432 A1* | 9/2006 | Nagatomi et al. | 313/487 |
| 2008/0113460 A1 | 5/2008 | Shelton et al. | |
| 2008/0283849 A1* | 11/2008 | Imai | 257/89 |
| 2009/0152571 A1* | 6/2009 | Su et al. | 257/89 |
| 2009/0152572 A1* | 6/2009 | Su et al. | 257/89 |
| 2010/0006871 A1* | 1/2010 | Imai et al. | 257/89 |
| 2010/0007267 A1* | 1/2010 | Imai et al. | 313/503 |
| 2010/0213881 A1* | 8/2010 | Imai | 315/363 |
| 2011/0115406 A1* | 5/2011 | Wang et al. | 315/294 |
| 2011/0222264 A1* | 9/2011 | Matsuda et al. | 362/84 |
| 2011/0248303 A1* | 10/2011 | Suzuki et al. | 257/98 |
| 2012/0248477 A1* | 10/2012 | Tischler et al. | 257/89 |
| 2013/0188333 A1* | 7/2013 | Ooya et al. | 362/84 |
| 2015/0022114 A1* | 1/2015 | Kim | 315/294 |
| 2015/0062892 A1* | 3/2015 | Krames et al. | 362/231 |

FOREIGN PATENT DOCUMENTS

| | | |
|---|---|---|
| JP | 2005-340748 A | 12/2005 |
| JP | 2007-067000 A | 3/2007 |
| JP | 2007-517404 A | 6/2007 |
| JP | 2009-260319 A | 11/2009 |
| JP | 2011-216868 A | 10/2011 |

* cited by examiner

FIG. 5A

| Temperature | Ra |
|---|---|
| 20°C | 82 |
| 50°C | 92 |
| 80°C | 98 |

FIG. 5B

| Temperature | Ra |
|---|---|
| 20°C | 78 |
| 50°C | 90 |
| 80°C | 95 |

F I G. 15
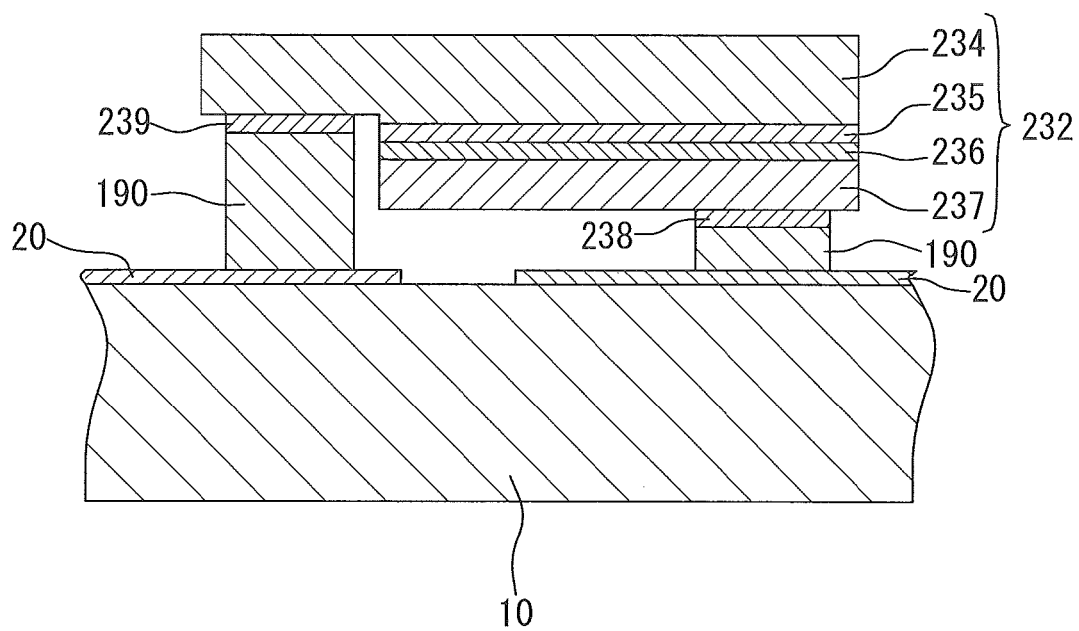

LIGHT EMITTING DEVICE COMPRISING CHIP-ON-BOARD PACKAGE SUBSTRATE AND METHOD FOR MANUFACTURING

TECHNICAL FIELD

The present invention relates to a light emitting device having a chip-on-board type package substrate, and a method for manufacturing the same.

BACKGROUND ART

In recent years, as a light emitting device using an LED element, a chip-on-board (COB) type light emitting device has attracted attention. The chip-on-board technology means a technology where a chip is directly mounted on the circuit pattern of a large package substrate with the chip of a light emitting element etc. not being mounted into a small package once. When a white light emitting device is produced, yellow phosphors are generally included in a sealing resin that seals an LED element after a blue LED element has been mounted.

Here, when the blue LED element is combined with the yellow phosphors, there is a problem that color rendering property is low. Accordingly, when the color rendering property is required for the white light emitting device, a method is adopted where green phosphors and red phosphors are included in the sealing resin in addition to the yellow phosphors. However, in the method where the color rendering property is compensated by various kinds of phosphors when one kind of LED element is used as a light emitting source, loss is large in case that the conversion of wavelength occurs in respective phosphors, which necessarily decreases the amount of light.

The light emitting device described in patent document 1 has been proposed as one which can change color temperature while maintaining high color rendering property, without using red phosphors with particularly large loss. This light emitting device comprises: a device substrate; a light emitting part group of first color temperature and a light emitting part group of second color temperature which are arranged in a predetermined arrangement pattern on the device substrate; a power supply and a circuit pattern which independently supply electric current to each of the light emitting part groups; and a controller which controls the ratio of the electric current supplied to each of the light emitting part groups from the power supply.

Here, the light emitting part group of the first color temperature has a plurality of blue-light-emitting type LED chips and a first phosphor layer which seals these LED chips and includes first phosphors. The light emitting part group of the second color temperature, which is lower than the first color temperature, has LED chips, the first phosphor layer which seals these LED chips, and a second phosphor layer which is arranged on the first phosphor layer and which includes second phosphors.

CITATION LIST

Patent Literature

Patent Document 1: JP 2008-218485 A

SUMMARY OF INVENTION

Technical Problem

However, in the light emitting device described in patent document 1, the power supply and the circuit pattern must be separately provided so that the electric current may be independently supplied to each of the light emitting part groups, and the controller which controls the ratio of the electric current supplied to each of the light emitting part groups must be also provided. These things make it difficult to put the light emitting device into practical use.

The present invention is devised in consideration of the above situation; the object of the present invention is to provide a light emitting device, which has a chip-on-board type package substrate capable of improving color rendering property without excessively reducing the amount of light emission, and a method for manufacturing the same; this improvement is achieved even for a chip-on-board type light emitting device in which a special circuit pattern is not provided and electric current control is not performed.

Solution to Problem

In the present invention, there is provided a chip-on-board type light emitting device in which a plurality of LED elements are directly mounted on a package board; the chip-on-board type light emitting device has a circuit pattern having a plurality of mounting parts which are formed on the package substrate and on which a plurality of LED elements are mounted and having a pair of an anode electrode and a cathode electrode; each LED element mounted on the circuit pattern is configured to include plural kinds of LED elements, which are different from one another in light emission wavelength and in temperature characteristics, so that an average color rendering index (Ra) as a whole device may become larger at an operating temperature than at an ordinary temperature by using the temperature characteristics of the plural kinds of LED elements.

According to this chip-on-board type light emitting device, each LED element emits light by applying electric current to the anode electrode and the cathode electrode of the circuit pattern. When each LED element emits light, temperature rises as each LED element itself generates heat, changing the amount of light emitted from each LED element. This change in the amount of light depends on the temperature characteristics of each kind of LED element. In this way, although the amount of light of each kind of LED element changes, since the average color rendering index (Ra) as the whole device is configured to become larger at the operating temperature than at the ordinary temperature, comparatively high color rendering property is realized. Each LED element may be either a face-up type one or a flip-chip type one.

In the above chip-on-board type light emitting device, the plural kinds of LED elements may include a blue LED element, a green LED element and a red LED element.

According to this chip-on-board type light emitting device, blue color light, green color light and red color light are emitted from respective LED elements, and by using the difference of these temperature characteristics, the color rendering index (Ra) is configured to become larger at the operating temperature than at the ordinary temperature.

In the above chip-on-board type light emitting device, the power attenuation factor from the ordinary temperature to the operating temperature may be 8 to 20% for the blue LED element, 10 to 40% for the green LED element and 10 to 60% for the red LED element.

The above chip-on-board type light emitting device may include yellow phosphors which emit yellow light if exited by the blue LED element.

According to this chip-on-board type light emitting device, the amount of light in a yellow color region is covered by the yellow phosphors.

In the above chip-on-board type light emitting device, the plural kinds of LED elements may include a blue LED element and a red LED element, and also may include green phosphors, which emit green light if exited by the blue LED element or the red LED element, and yellow phosphors, which emit yellow light if exited by the blue LED element or the red LED element.

Upon manufacturing the above chip-on-board type light emitting device, there is provided a method for manufacturing the same; the method includes a mounting step and a removing step; in the mounting step, a plurality of flip-chip type LED elements, each of which has a growth substrate, a semiconductor light emitting part on the growth substrate and electrodes on the semiconductor light emitting part, are mounted on a package substrate; in the removing step, with each of the LED elements being mounted on the growth substrate, the growth substrate is removed.

According to the method for manufacturing this light emitting device, in the mounting step, a plurality of LED elements are mounted on the package substrate using a flip-chip technique, and each LED element is electrically connected with the package substrate. Next, the growth substrate is removed in the removing step, and the semiconductor light emitting part remains on the package substrate. In this way, since only a semiconductor layer remains on the package substrate, there is no deterioration in optical and thermal performance originating in the growth substrate. Moreover, since the growth substrate is removed after the LED element is mounted, a thin semiconductor layer can be formed on the package substrate.

Advantageous Effect of Invention

According to the present invention, there are provided a chip-on-board type light emitting device, which can improve color rendering property without excessively reducing the amount of light emission, and a method for manufacturing the same; this improvement is attained even for a chip-on-board type light emitting device in which a special circuit pattern is not provided and electric current control is not performed.

BRIEF DESCRIPTION OF DRAWINGS

FIG. 5 shows tables (a), (b) presenting the relationship between temperature and an average color rendering index (Ra) in the light emitting device; table (a) corresponds to a case where yellow phosphors are included in addition to a blue LED element, a green LED element and a red LED element, while table (b) corresponds a case where yellow phosphors are not included.

FIG. 15 shows a variation, and is an explanatory view showing a state where the growth substrate of the blue LED element has been removed.

DESCRIPTION OF EMBODIMENT

Figure 1:
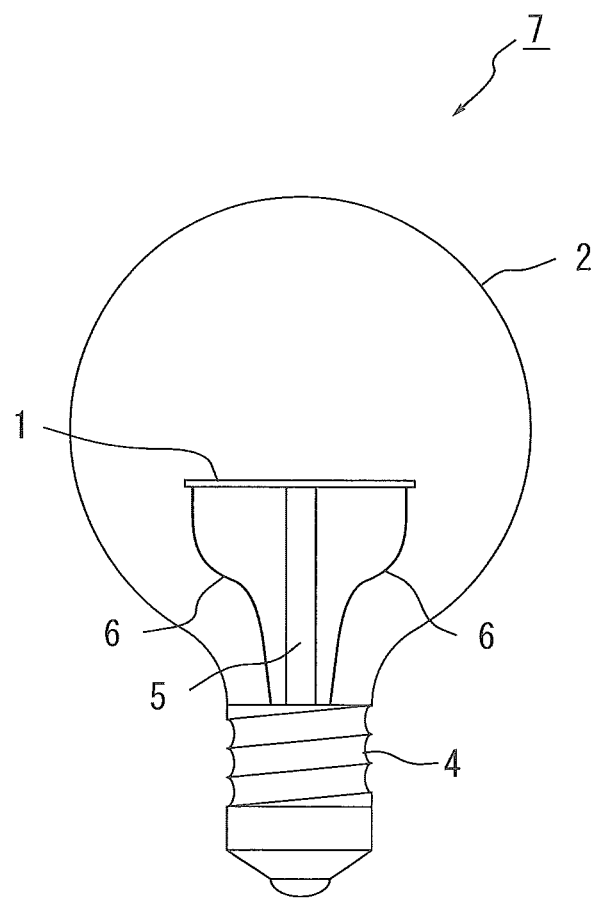
FIG. 1 is a schematic side view of a light emitting device showing an embodiment of the present invention.

FIGS. 1 to 5 show a first embodiment of the present invention, and FIG. 1 is a schematic side view of a light emitting device. As shown in FIG. 1, this light emitting device 7 has a glass case 2 and a terminal part 4 which is formed below the case 2 and which is electrically connected with an external power supply, and a package substrate 1 is accommodated inside the case 2. The package substrate 1 is supported by a supporting part 5 which extends from the terminal part 4 and which is made of inorganic material, and is electrically connected with the terminal part 4 through an inside conducting wire 6.

Figure 2:
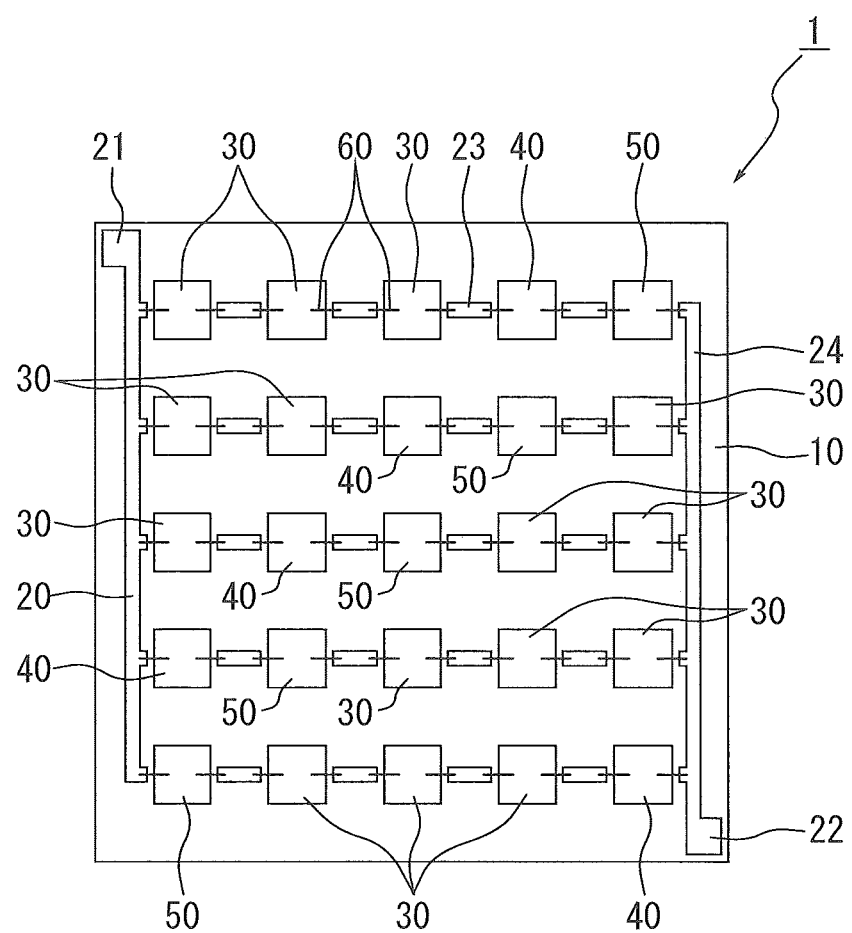
FIG. 2 is a plan view of a package substrate.

FIG. 2 is a plan view of the package substrate. As shown in FIG. 2, the package substrate 1 is a chip-on-board type one in which a plurality of LED elements 30, 40, 50 are directly mounted on a package substrate body 10. The light emitting device 7 includes the package substrate body 10, a circuit pattern 20 formed on the package substrate body 10, and the plurality of LED elements 30, 40, 50 mounted on the package substrate body 10. Moreover, the light emitting device 7 includes a sealing resin 70 which seals each of the LED elements 30, 40, 50 on the package substrate body 10 (see FIG. 3). The package substrate 1 is directly connected with the inside conducting wire 6.

Although the material of the package substrate body 10 is selected arbitrarily, for example, AlN, Si, Cu, $Al_2O_3$, SiC, etc. are used. It is also possible to use, for example, synthetic resins such as glass epoxy etc. for the package substrate body 10. In this embodiment, the package substrate body 10 is formed in a square shape, and each of the LED elements 30, 40, 50 is arranged in alignment both in a longitudinal direction and in a transverse direction.

The circuit pattern 20 has a pair of an anode electrode 21 and a cathode electrode 22, and supplies electric power to each of the LED elements 30, 40, 50. The circuit pattern 20 has a plurality of mounting parts on which each of the LED elements 30, 40, 50 is mounted; the circuit pattern 20 has a series connecting part 23, in which each of the LED elements 30, 40, 50 is arranged in the series connection of plural elements, and a parallel connecting part 24 which connects both ends of each series connecting part 23 with the anode electrode 21 or the cathode electrode 22. In this embodiment, five LED elements 30, 40, 50 are arranged in a series connecting part 23; five series connecting parts 23 are connected with the parallel connecting parts 24; there are five rows of LED elements 30, 40, 50 both in the longitudinal direction and in the transverse direction; thus a total of twenty-five LED elements 30, 40, 50 are used.

In this embodiment, three kinds of LED elements, i.e. a blue LED element 30, a green LED element 40, red LED element 50, are used, and plural kinds of LED elements are electrically controlled in an integral manner. The blue LED element 30, the green LED element 40 and the red LED element 50 are different from one another in not only light emission wavelength but also in temperature characteristics. In each series connecting part 23, three blue LED elements 30, one green LED element 40 and one red LED element 50 are mounted.

The blue LED element 30 and the green LED element 40 have an InGaN-based light emitting layer, for example, and the red LED element 50 has a GaAs-based light emitting layer, for example. A peak wavelength can be set at 450 nm for the blue LED element 30, and 525 nm for the green LED element 40, and 630 nm for the red LED element 50, for example. In this embodiment, each of the LED elements 30, 40, 50 is face-up type one, and is electrically connected with the series connecting part 23 of the circuit pattern 20 through a wire 60 respectively.

In this embodiment, the power attenuation factor from an ordinary temperature to an operating temperature in the blue LED element 30 is larger than that in the green LED element 40 and in the red LED element 50. For example, assuming that the ordinary temperature is 20° C. and the operating temperature is 80° C., the attenuation factor of the amount of light can be set to 15% for the blue LED element 30, and 10% for the green LED element 40, and 10% for the red LED element 50.

Figure 3:
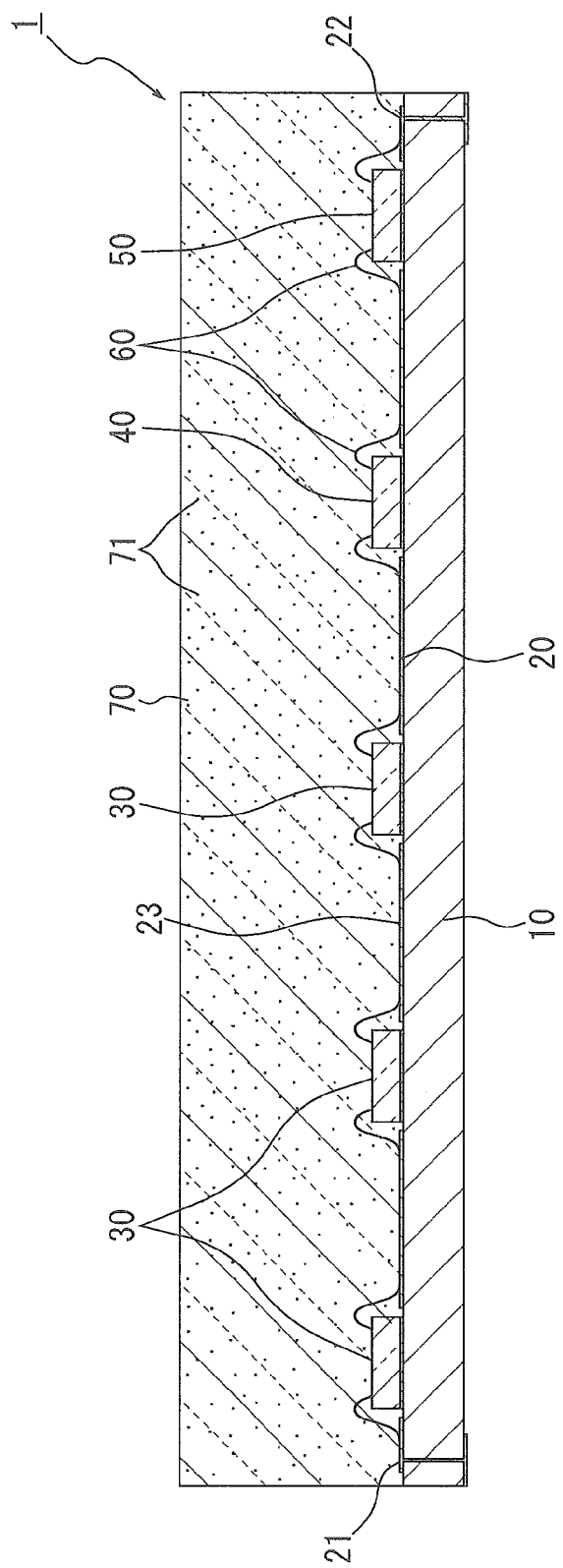
FIG. 3 is a cross sectional view of a package substrate.

FIG. 3 is a cross sectional view of the package substrate. As shown in FIG. 3, each of the LED elements 30, 40, 50 on the package substrate body 10 is sealed with the sealing resin 70. A transparent resin such as an epoxy-based resin or a silicone-based resin can be used as the sealing resin 70. In the sealing resin 70, phosphors 71 are contained, which emit yellow light if exited by blue light emitted from the blue LED element 30. As the phosphors 71 which emit yellow light if exited by blue light, YAG-based (Yttrium-Aluminum-Garnet-based) phosphors or silicate-based phosphors can be used.

In the light emitting device 7 configured as described above, by applying electric current to the anode electrode 21 and the cathode electrode 22 of the circuit pattern 20, light with an expected wavelength is emitted from each of the LED elements 30, 40, 50 and from the yellow phosphors 71. As a result, white light is emitted from the light emitting device 7.

When each of the LED elements 30, 40, 50 emits light, each of the LED elements itself generates heat, which changes the amount of light emitted from each of the LED elements 30, 40, 50. This change in the amount of light depends on the temperature characteristics of each kind of LED element 30, 40, 50. In the light emitting device 7 of this embodiment, although the amount of light of each kind of LED element 30, 40, 50 changes, since the average color rendering index (Ra) as the whole device is configured to become larger at the operating temperature than at the ordinary temperature, comparatively high color rendering property is realized. Thereby, color rendering property can be improved without excessively reducing the amount of light emission. This improvement is attained even for a chip-on-board type package substrate 1 in which a special circuit pattern is not provided and electric current control is not performed.

Figure 4:
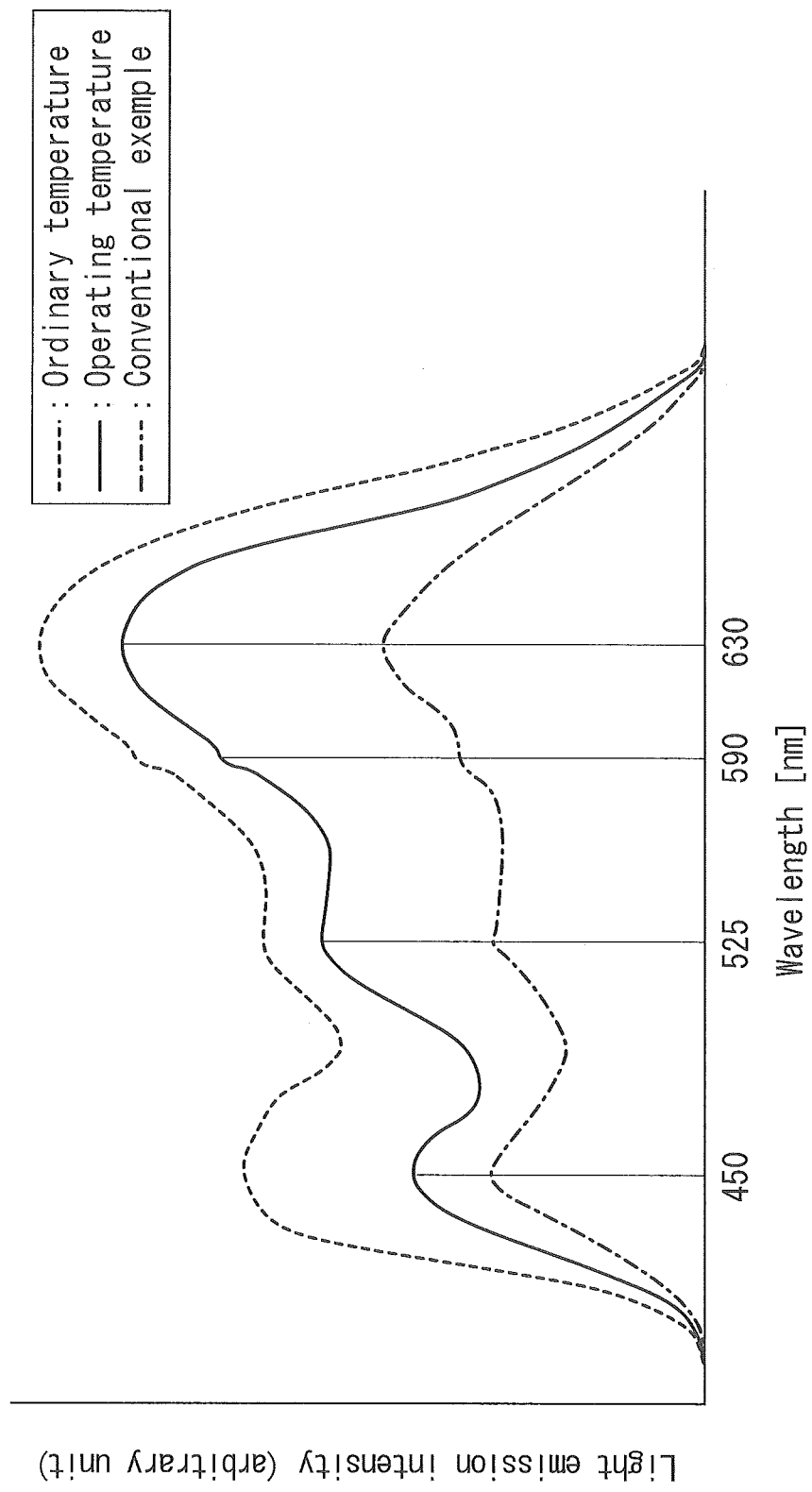
FIG. 4 is a graph showing an example of the light emission spectrum of the light emitting device.

FIG. 4 is a graph showing an example of the light emission spectrum of the light emitting device. Here, the axis of ordinate represents light emission intensity, and the axis of abscissa represents wavelength. The broken line corresponds to a light emission spectrum at the ordinary temperature, and the solid line corresponds to a light emission spectrum at the operating temperature. Upon acquiring the data of FIG. 4, the light emitting device 7 was used, in which a peak wavelength is 450 nm for the blue LED element 30, and is 525 nm for the green LED element 40, and is 630 nm for the red LED element 50, and the peak wavelength of the yellow phosphors 71 is 590 nm. The light emission spectrum of a conventional light emitting device, in which green phosphors, yellow phosphors and red phosphors are used in addition to a blue LED element, is shown in a dashed dotted line. FIG. 5 shows tables (a), (b) presenting the relationship between temperature and an average color rendering index (Ra) in the light emitting device; table (a) corresponds to a case where the yellow phosphors are included in addition to the blue LED element, the green LED element and the red LED element, and table (b) corresponds a case where the yellow phosphors are not included.

Since the amount of light of each of the LED elements 30, 40, 50 and of the yellow phosphors 71 decreases with temperature rise, the amount of light as a whole decreases when the use of the light emitting device 7 is started, as shown in FIG. 4. However, the light emitting device 7 of this embodiment is configured so that the average color rendering index (Ra) may become larger when each light emitting component of the blue LED element 30, the green LED element 40 and the red LED element 50 attenuates.

Specifically, when the yellow phosphors 71 were included, the following results were successfully obtained: Ra at the ordinary temperature (20° C.) is 82, and Ra at 50° C. is 92, and Ra at the operating temperature (80° C.) is 98, as shown in FIG. 5 (*a*). When the yellow phosphors 71 were not included, the following results were obtained: Ra at the ordinary temperature (20° C.) is 78, and Ra at 50° C. is 90, and Ra at the operating temperature (80° C.) is 95, as shown in FIG. 5 (*b*). In this way, regardless of the existence of the yellow phosphors 71, Ra can be increased with the temperature rise of the light emitting device 7.

Although a method using three kinds of LED elements, i.e. the blue, green and red LED elements, was shown in the embodiment described above, it is needless to say that a method using two kinds of LED elements is also applicable to the present invention. Moreover, although it was shown that the power attenuation factor of the blue LED element was higher than that of the green LED element or of the red LED element, it may be configured that the power attenuation factor of the green LED element or of the red LED element is higher than those of others. What is necessary is that color rendering property is just configured to become higher by using the difference of temperature characteristics. Moreover, the detailed configuration and the like of the light emitting device 7 can also be modified properly.

Furthermore, the power attenuation factor of each LED element can be modified arbitrarily as follows: for example, the power attenuation factor can be set in a range from 8 to 20% for the blue LED element 30, and in a range from 10 to 40% for the green LED element 40, and in a range from 10 to 60% for the red LED element 50.

Moreover, as the phosphors 71, it is possible to use up-conversion phosphors which emit yellow light if exited by red light emitted from the red LED element 50. Still further, the phosphors 71 can be composed by mixing phosphors exited by red light and phosphors exited by blue light.

Now, the inventor in this application has found that Ra can efficiently become larger at the operating temperature than at the ordinary temperature using the following method: instead of providing the green LED element 40, there are provided green phosphors which emit green light if exited by the blue LED element 30; in addition, there are combined the blue LED element 30 with the attenuation factor of 8 to 12%, the red LED element 50 with the attenuation factor of 30 to 40% and the phosphors 71 which emit yellow light exited by blue light emitted from the blue LED element 30. When the phosphors 71 were adjusted so that the attenuation factor around 550 nm might be 8 to 12%, Ra of 92 at the ordinary temperature (25° C.) and Ra of 96 at the operating temperature (80° C.) were successfully obtained. Here, the attenuation factor of the phosphors is adjustable mainly by the concentration of the phosphors in the sealing resin. In a configuration like this, when the luminous intensity of the blue LED element 30 is set to 100 mcd or more and to 500 mcd or less, and when the luminous intensity of the red LED element 50 is set to 3000 mcd or more, a state where Ra does not decrease can be obtained even if the red LED attenuates. Moreover, it is preferred that the ratio of light emission intensity in the peak wavelength of the blue LED element 30 and of the red LED element 50 is in a range from 1:4 to 1:6 at the ordinary temperature (25° C.), and is in a range from 1:2.5 to 1:3.5 at the operating temperature (80° C.). Light emission intensity around 550 nm originating in the phosphors needs to be set to between light emission intensity in the peak wavelength of the blue LED element 30 and light emission intensity in the peak wavelength of the red LED element 50 both at the ordinary temperature and at the operating temperature.

Figure 6:
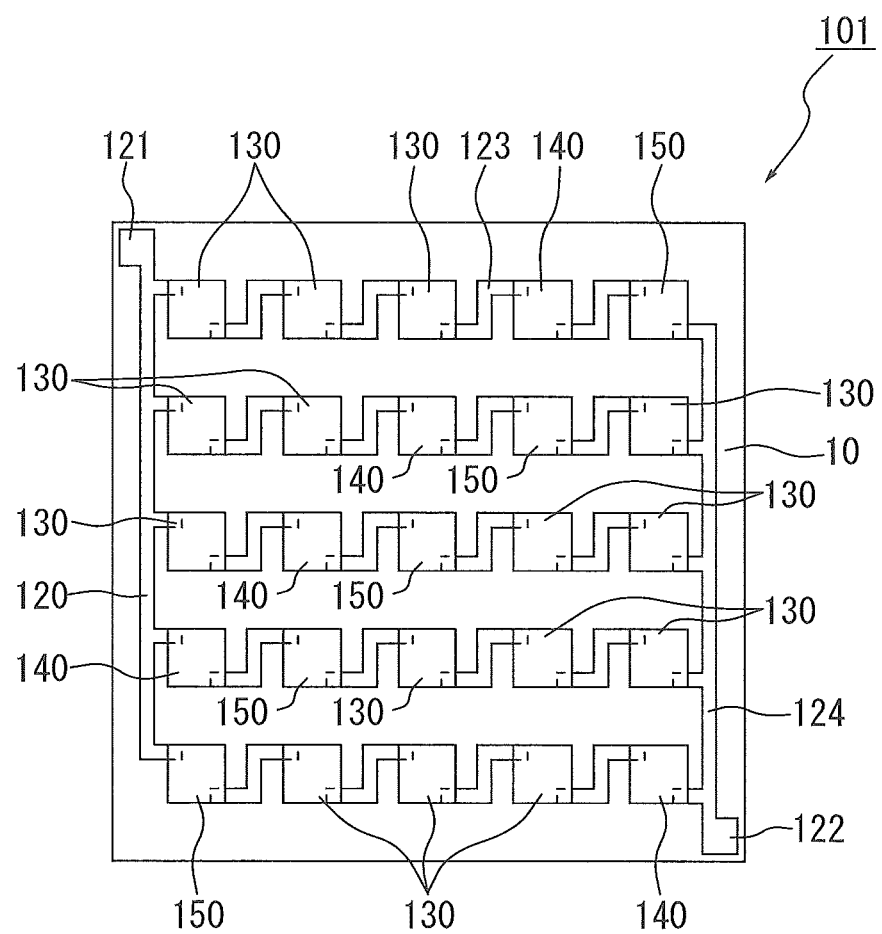
FIG. 6 is a plan view of a package substrate showing a second embodiment of the present invention.

FIGS. 6 to 12 show a second embodiment of the present invention, and FIG. 6 is a plan view of a package substrate.

As shown FIG. 6, the package substrate 101 of this light emitting device 7 includes a package substrate body 10, a circuit pattern 120 formed on the package substrate body 10, a plurality of LED elements 130, 140, 150 mounted on the package substrate body 10. Moreover, the light emitting device 7 includes a sealing resin 70 which seals each of the LED elements 130, 140, 150 on the package substrate body 10 (see FIG. 13).

The circuit pattern 120 has a pair of an anode electrode 121 and a cathode electrode 122, and supplies electric power to each of the LED elements 130, 140, 150. The circuit pattern 120 has a series connecting part 123, in which each of the LED elements 130, 140, 150 is arranged in the series connection of plural elements, and a parallel connecting part 124 which connects both ends of each series connecting part 123 with the anode electrode 121 or the cathode electrode 122. In this embodiment, five LED elements 130, 140, 150 are arranged in a series connecting part 123; five series connecting parts 123 are connected with the parallel connecting parts 124; there are five rows of LED elements 130, 140, 150 both in the longitudinal direction and in the transverse direction; thus a total of twenty-five LED elements 130, 140, 150 are used.

Also in this embodiment, when each of the LED elements 130, 140, 150 emits light, each of the LED elements itself generates heat, which changes the amount of light emitted from each of the LED elements 130, 140, 150. This change in the amount of light depends on the temperature characteristics of each kind of LED element 130, 140, 150. In the light emitting device 7 of this embodiment, although the amount of light of each kind of LED element 130, 140, 150 changes, since the average color rendering index (Ra) as the whole device is configured to become larger at the operating temperature than at the ordinary temperature, comparatively high color rendering property is realized.

Figure 7A:
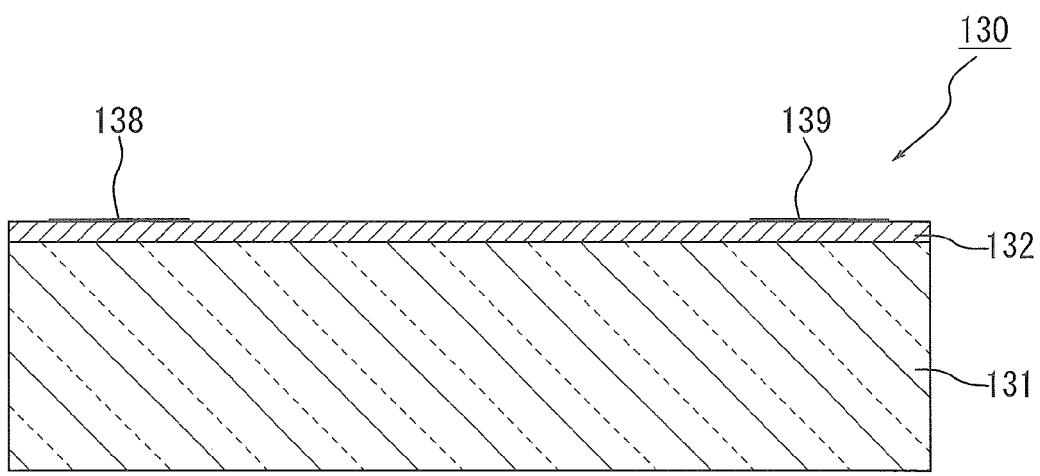
FIG. 7A is a schematic entire cross sectional view of a blue LED element mounted on a package substrate body before a growth substrate is removed.

FIG. 7A is a schematic entire cross sectional view of the blue LED element mounted on the package substrate body before a growth substrate is removed. As shown in FIG. 7A, this blue LED element 130 is a flip-chip type one, and is structured such that a semiconductor light emitting part 132 consisting of group-III nitride semiconductor layers is formed on the surface of a growth substrate 131. The growth substrate 131 is made of sapphire, for example. As described later, on the semiconductor light emitting part 132, a p-side electrode 138 and an n-side electrode 139 are formed.

Figure 7B:
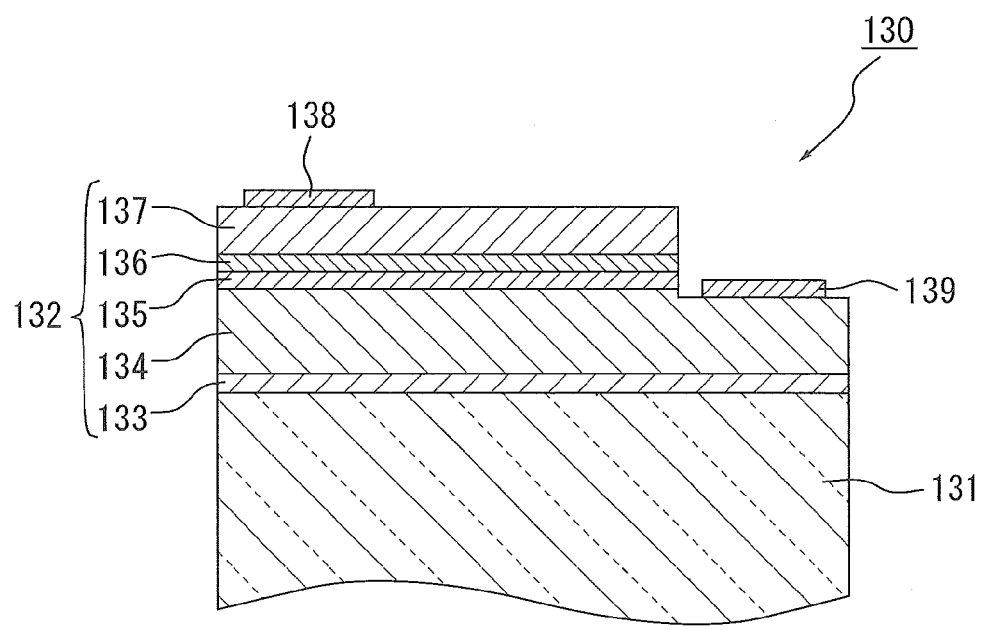
FIG. 7B is a schematic enlarged cross sectional view of the blue LED element before the growth substrate is removed.

FIG. 7B is a schematic enlarged cross sectional view of the blue LED element before the growth substrate is removed. In illustrating FIG. 7B, a part of the growth substrate 131 is omitted for easy explanation. As shown in FIG. 7B, a semiconductor light emitting part 132 has a buffer layer 133, an n-type GaN layer 134, an active layer 135, a light guide layer 136, and a p-type GaN layer 137 in this order from the side of the growth substrate 131. A p-side electrode 138 is formed on the p-type GaN layer 137, and also an n-side electrode 139 is formed on the n-type GaN layer 134.

The buffer layer 133 is formed on the growth substrate 131, and is made of AlN, for example. The buffer layer 133 may be made of GaN. The n-type GaN layer 134 as a first conduction type layer is formed on the buffer layer 133, and is made of n-type GaN. The active layer 135 as a light emitting layer is formed on the n-type GaN layer 134, and made of GaInN. With electrons and holes injected, the active layer 135 emits blue light. A multiple quantum well structure can also be used as the active layer 135.

The light guide layer 136 is formed on the active layer 135, and is made of p-type AlGaN. The p-type GaN layer 137 as a second conduction type layer is formed on the light guide layer 136, and is made of p-type GaN. Layers from the n-type GaN layer 134 to the p-type GaN layer 137 are formed by the epitaxial growth of group-III nitride semiconductors. Here, the thickness of each layer can be set at, for example, 40 nm for the buffer layer 133, 5 μm for the n-type GaN layer 134, 2.5 nm for the active layer 135, 20 nm for the light guide layer 136, 200 nm for the p-type GaN layer 137, and so the thickness of the semiconductor light emitting part 132 can be set at 5262.5 nm. The layer configuration of semiconductor layers is arbitrarily selected, if the layer configuration includes at least the first conduction type layer, the active layer and the second conduction type layer, and if light is emitted at the active layer due to the recombination of electrons and holes when electric current is applied to the first conduction type layer and the second conduction type layer.

The p-side electrode 138 is formed on the p-type GaN layer 137, and is made of material such as Au, for example. In this embodiment, the p-side electrode 138 is formed by a vacuum evaporation method, a sputtering method, a CVD (Chemical Vapor Deposition) method, etc. Etching is performed from the p-type GaN layer 137 to the n-type GaN layer 134, and the n-side electrode 139 is formed on the exposed n-type GaN layer 134. The n-side electrode 139 is made of W/Al/Au, for example, and is formed by the vacuum evaporation method, the sputtering method, the CVD (Chemical Vapor Deposition) method, etc.

Figure 7C:
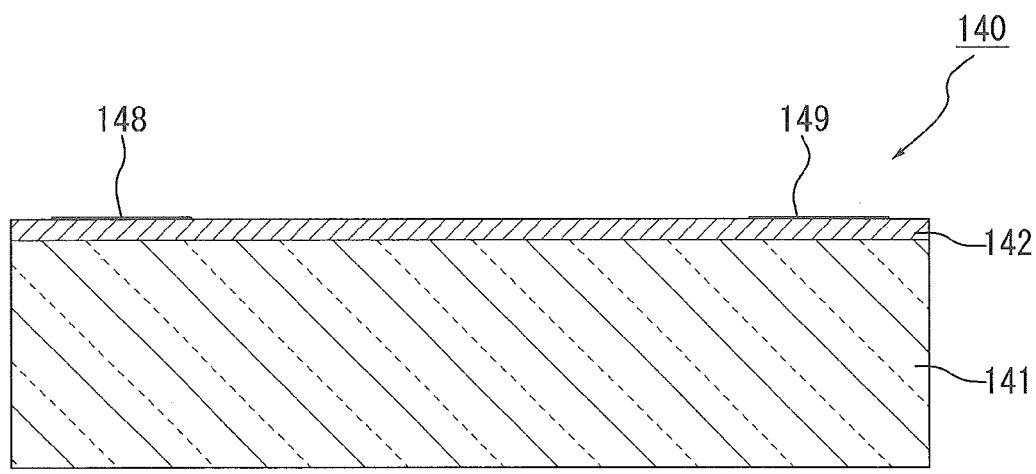
FIG. 7C is a schematic entire cross sectional view of a green LED element mounted on the package substrate body before a growth substrate is removed.

FIG. 7C is a schematic entire cross sectional view of a green LED element mounted on the package substrate body before a growth substrate is removed. As shown in FIG. 7C, this green LED element 140 is a flip-chip type one, and is structured such that a semiconductor light emitting part 142 consisting of group-III nitride semiconductor layers is formed on the surface of the growth substrate 141. The growth substrate 141 is made of sapphire, for example. As described later, on the semiconductor light emitting part 142, a p-side electrode 148 and an n-side electrode 149 are formed. Here, the detailed element configuration of the green LED element 140 is not described in detail.

Figure 7D:
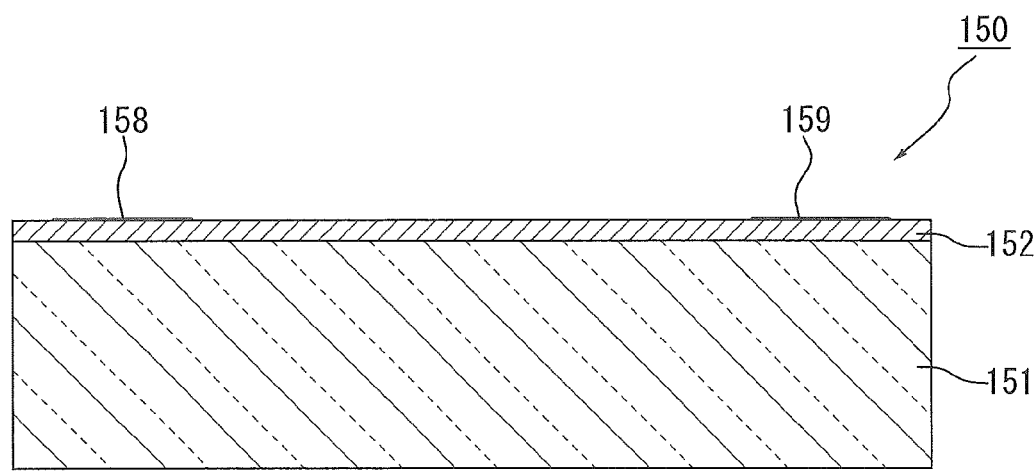
FIG. 7D is a schematic enlarged cross sectional view of a red LED element before a growth substrate is removed.

FIG. 7D is a schematic enlarged cross sectional view of a red LED element before a growth substrate is removed. As shown in FIG. 7D, this red LED element 150 is a flip-chip type one, and is structured such that a semiconductor light emitting part 152 consisting of GaAs-based semiconductor layers is formed on the surface of the growth substrate 151. The growth substrate 151 is made of GaAs, for example. As described later, on the semiconductor light emitting part 152, a p-side electrode 158 and an n-side electrode 159 are formed. Here, the detailed element configuration of the red LED element 150 is not described in detail.

A method for manufacturing the light emitting device will be described below with reference to FIGS. 8 to 12. The method for manufacturing the light emitting device of this embodiment is described as follows: there are provided a plurality of flip-chip type LED elements 130, 140, 150 which are independent from one another and which respectively have the growth substrates 131, 141, 151, the semiconductor light emitting parts 132, 142, 152 on the growth substrates 131, 141, 151, and the electrodes 138, 139, 148, 149, 158, 159 on the semiconductor light emitting parts 132, 142, 152; the method for manufacturing the light emitting device includes a selecting step and a mounting step: in the selecting step, there are selected LED elements 130, 140, 150 which meet expected performance from the LED elements 130, 140, 150 provided above; in the mounting step, a plurality of LED elements 130, 140, 150 selected in the selecting step are directly mounted on the package substrate body 10, with each of the LED elements not being joined with other growth substrates 131, 141, 151 and with each kind of the LED elements 130, 140, 150 separately positioned. Moreover, the method for manufacturing the light emitting device of this embodiment includes a peeling step and an eliminating step for the blue LED element and the green LED element; in the peeling step, with each of the LED elements 130, 140 directly mounted on the package substrate body 10, and without scanning a laser beam with a spot diameter larger than the LED elements 130, 140, and with the entire of each of the LED elements 130, 140 individually irradiated by the laser beam in a uniform manner, the entire parts of the growth substrates 131, 141 are peeled; in the eliminating step, the debris of the growth substrates 131, 141 on the package substrate body 10 is eliminated at once by spraying gas. Although the blue LED element 130 is explained as an example in each figure, similar processing is also performed for the green LED element 140 and the red LED element 150.

First, there are selected LED elements 130, 140, 150, which meet expected performance suitable for the light emitting device. Here, the expected performance means: whether or not the LED elements 130, 140, 150 light when energized, if there is no problem in the dispersion of quality for the light emitting device manufactured; or whether or not the forward-direction voltage, the amount of light, color tone and the like of the LED elements 130, 140, 150 are within the range of predetermined design, if there is a problem in the dispersion of quality for the light emitting device. That is, defective LED elements 130, 140, 150 such as those unable to light are at least removed at this stage.

Figure 8:
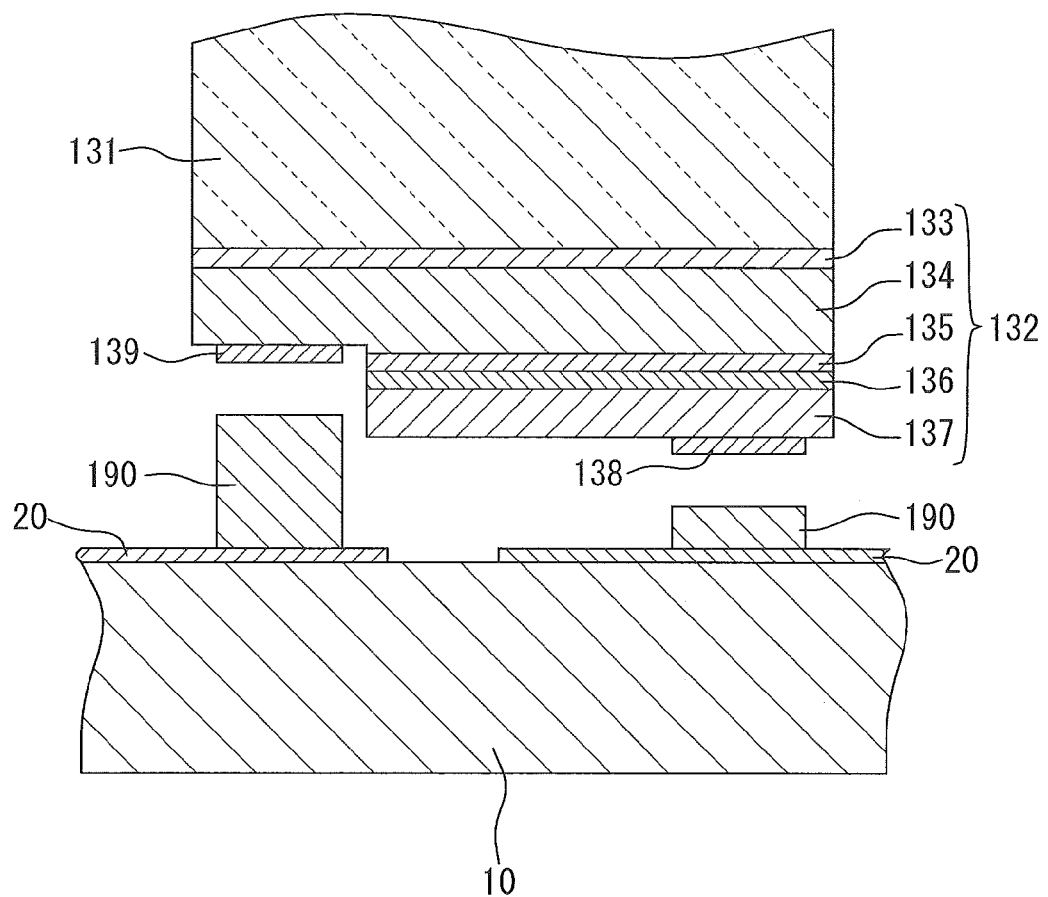
FIG. 8 is an explanatory view showing a state where the blue LED element is set above the mounting position of the package substrate body.

FIG. 8 is an explanatory view showing a state where the blue LED element is set above the mounting position of the package substrate body. As shown in FIG. 8, a solder 190 made of Au—Sn is vapor-deposited in advance on a connection part with which the blue LED element 130 in the package substrate body 10 is connected. Material other than Au—Sn can also be used for the solder 190.

Figure 9:
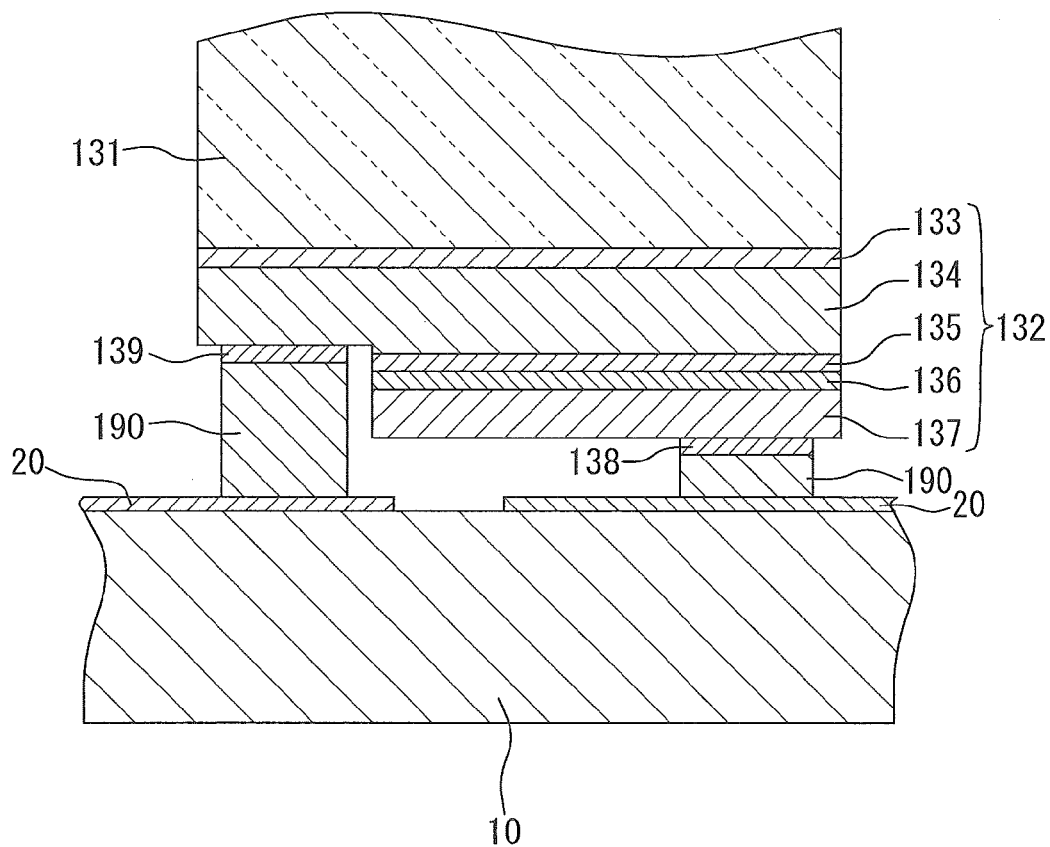
FIG. 9 is an explanatory view showing a state where the blue LED element is mounted on the package substrate body.

FIG. 9 is an explanatory view showing a state where the blue LED element has been mounted on the package substrate body. Next, as shown in FIG. 9, the p-side electrode 138 and the n-side electrode 139 are joined to the solder 190 under a predetermined atmosphere, at a predetermined temperature condition and at a predetermined loading condition. As the predetermined atmosphere, for example, the inert atmosphere of nitrogen etc. can be used, besides forming gas in which nitrogen and hydrogen are mixed. For example, the forming gas composed of 5% hydrogen and 95% nitrogen can be used. A load applied to each of the LED elements 130, 140, 150 is set to 5 gram weights or more and to 50 gram weights or less, for example. Although the temperature condition is determined arbitrarily, in order to melt the solder 190, the solder 190 needs to be heated to certain temperature (for example, 250° C. or more and 400° C. or less), which is higher than the eutectic temperature or the melting point of the material composing the solder 190. When the material of the solder 190 is Au—Sn solder composed of 80% Au and 20% Sn, it needs to be heated to 280° C. or more because its eutectic temperature is about 280° C. When the solder 190 is made of SnAgCu, for example, since the melting point of SnAgCu is 220° C., the solder 190 needs to be heated at least to 220° C. or more. In this way, by melting and solidifying the solder 190, each of the LED elements 130, 140, 150 is fixed to the package substrate body 10.

Figure 10:
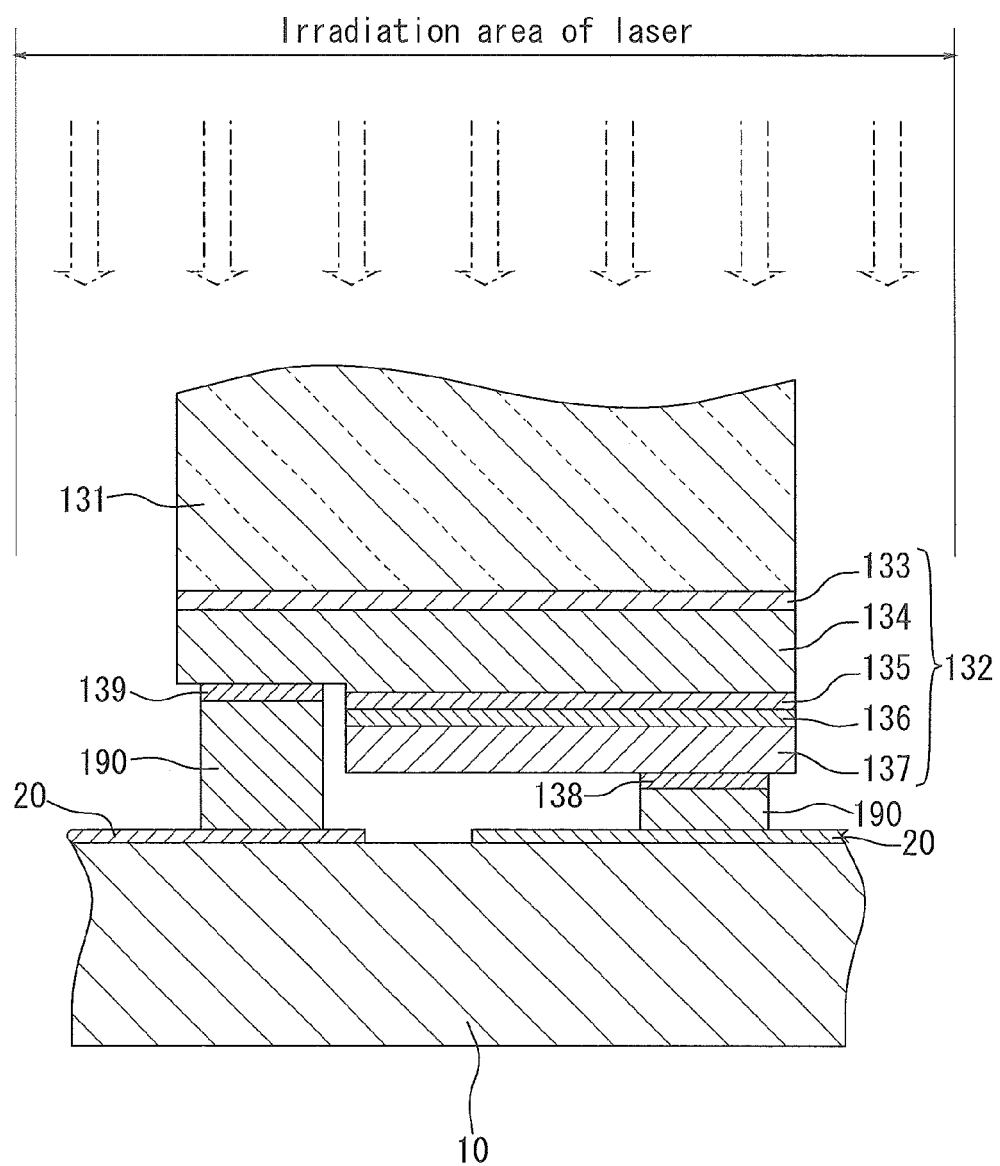
FIG. 10 is an explanatory view showing a state where laser light is being irradiated on the growth substrate of the blue LED element.

FIG. 10 is an explanatory view showing a state where laser light is being irradiated on the growth substrate of the blue LED element. Next, as shown in FIG. 10, a laser beam is irradiated on each of the LED elements 130, 140, 150 from above the package substrate body 10. Since the spot diameter of the laser beam is formed so as to be larger than the plan view area of each of the LED elements 130, 140, the entire of each of the LED elements 130, 140 can be irradiated by the laser beam without scanning the laser beam. Here, since the laser beam has the distribution of light intensity in a radial direction, as the spot diameter becomes larger than the LED elements 130, 140, the energy of the beam irradiating the LED elements 130, 140 becomes more uniform. Since each of the LED elements 130, 140 is a flip-chip type one, the growth substrates 131, 141 are located above, and the energy of the laser beam is applied to an interface between the growth substrates 131, 141 and the semiconductor light emitting parts 132, 142, which separates the growth substrates 131, 141 from the semiconductor light emitting parts 132, 142.

Here, the position of each of the LED elements 130, 140 is determined by recognizing and arranging each of the LED elements by a CCD camera or the like. This is enabled by the fact that each of the LED elements 130, 140 are mounted individually. For a state where the semiconductor light emitting parts 132, 142 are connected by a wafer-like substrate and a sub-mount, it is not possible to recognize a position by the CCD camera. If a scribe line is formed on a wafer so that a position may be recognizable by the CCD camera, a crack or strain will arise on a growth substrate. In this embodiment, since there is no need to consider the warp of a wafer etc. unlike a case where a laser beam is irradiated for a wafer state, it is possible to accurately focus the laser beam on the interface between the growth substrates 131, 141 and the semiconductor light emitting parts 132, 142.

Figure 11:
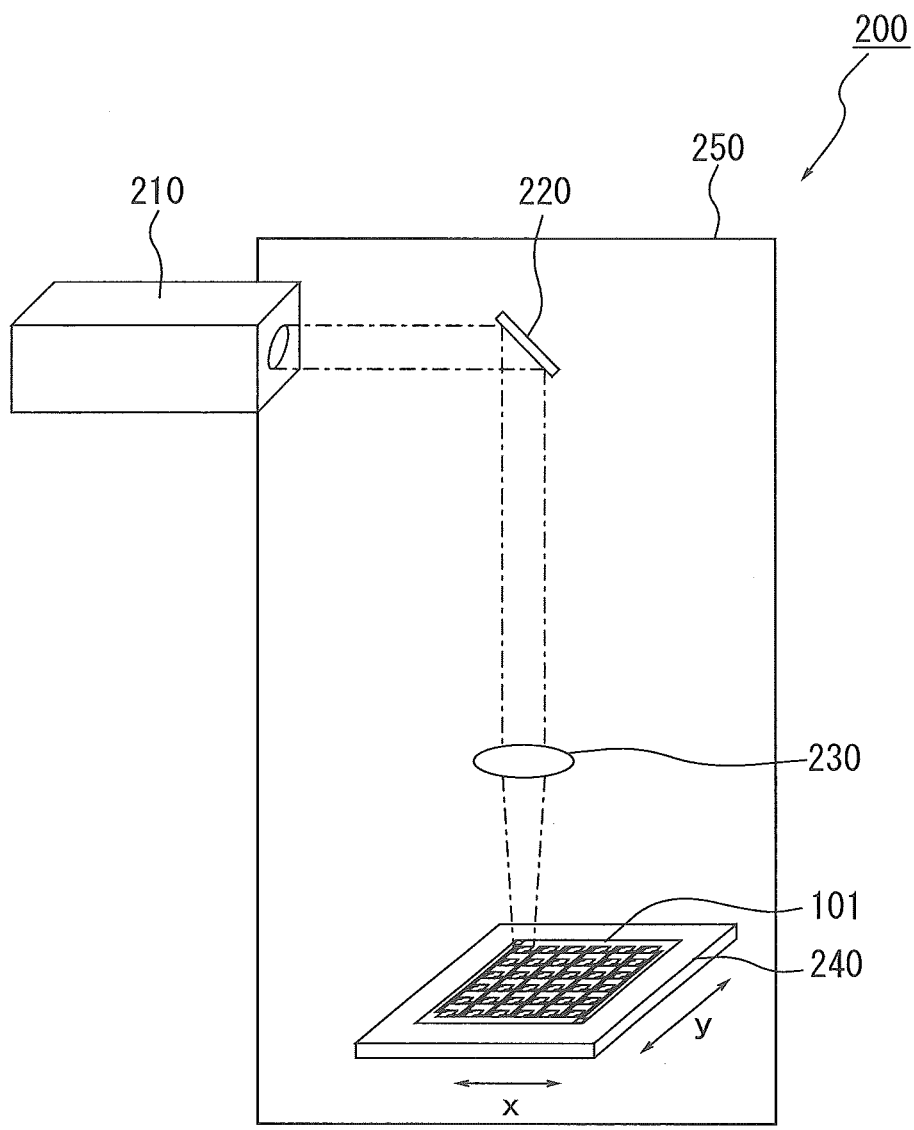
FIG. 11 is a schematic explanatory view of a laser irradiation apparatus.

Now, a laser irradiation method will be described with reference to FIG. 11. FIG. 11 is a schematic explanatory view of a laser irradiation apparatus. As shown in FIG. 11, the laser irradiation apparatus 200 includes a laser generator 210 which generates a laser beam, a mirror 220 which changes the direction of the laser beam generated, an optical lens 230 which focuses the laser beam, and a work object which is an object to be irradiated by the laser beam, that is, a stage 240 for supporting the package substrate body 10. Moreover, the laser irradiation apparatus 200 has a housing 250 which maintains the pass of the laser beam in a vacuum state.

As the Laser generator 210, an excimer laser of KrF, ArF, etc. can be used. The beam emitted by the laser generator 210 is reflected by the mirror 220 to change its direction. A plurality of mirrors 220 are used in order to change the direction of the laser beam. The optical lens 230 is located above the stage 240, and focuses the laser beam incident on the package substrate body 10.

The stage 240 is moved by movement means (not shown) in the x-direction and/or in the y-direction, and the laser beam moves on the package substrate 10 placed on the stage 240. The laser beam is irradiated through the growth substrates 131, 141, and is mainly absorbed by the interface between the growth substrates 131, 141 and the semiconductor light emitting parts 132, 142. The laser beam is irradiated with a spot diameter larger than each of the LED elements 130,140 if compared in a plane view. Here, the spot diameter can be set, for example, to 1 mm or more and to 10 mm or less.

Figure 12:
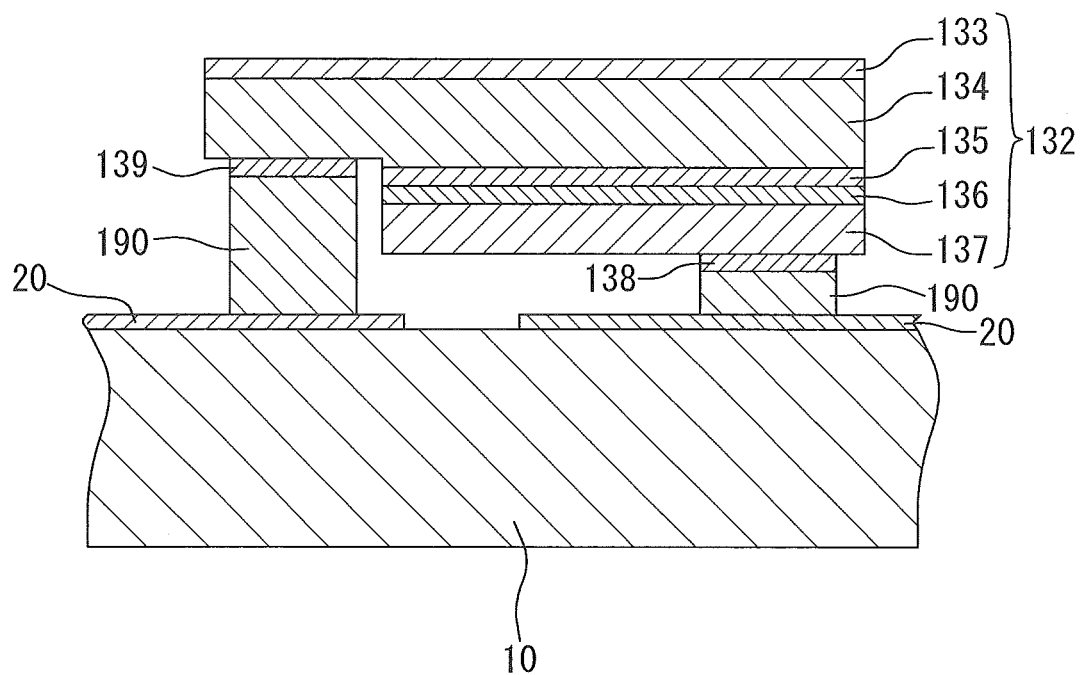
FIG. 12 is an explanatory view showing a state where the growth substrate of the blue LED element has been removed.

FIG. 12 is an explanatory view of a state where the growth substrate of the blue LED element has been removed. By peeling the entire parts of the growth substrates 131, 141 using the laser irradiation apparatus, only the semiconductor light emitting parts 132, 142 can be left on the package substrate body 10, as shown in FIG. 12. The debris of the growth substrates 131, 141 that have been peeled can be eliminated from on the package substrate body 10 by spraying gas on the package substrate body 10. That is, what is necessary is just to eliminate the debris of the growth substrates 131, 141 at once after all the growth substrates 131, 141 are peeled.

With regard to the red LED element 150, by removing the growth substrate 151 by etching, only the semiconductor light emitting part 152 can be left on the package substrate body 10. The entire of the growth substrate 151 may not necessarily be removed, and its thickness may be reduced to a required thickness. When the growth substrate 151 of the red LED element 150 is a GaAs substrate, the thickness of the GaAs substrate can be reduced to an arbitrary thickness by sulfuric acid based etching.

Figure 13:
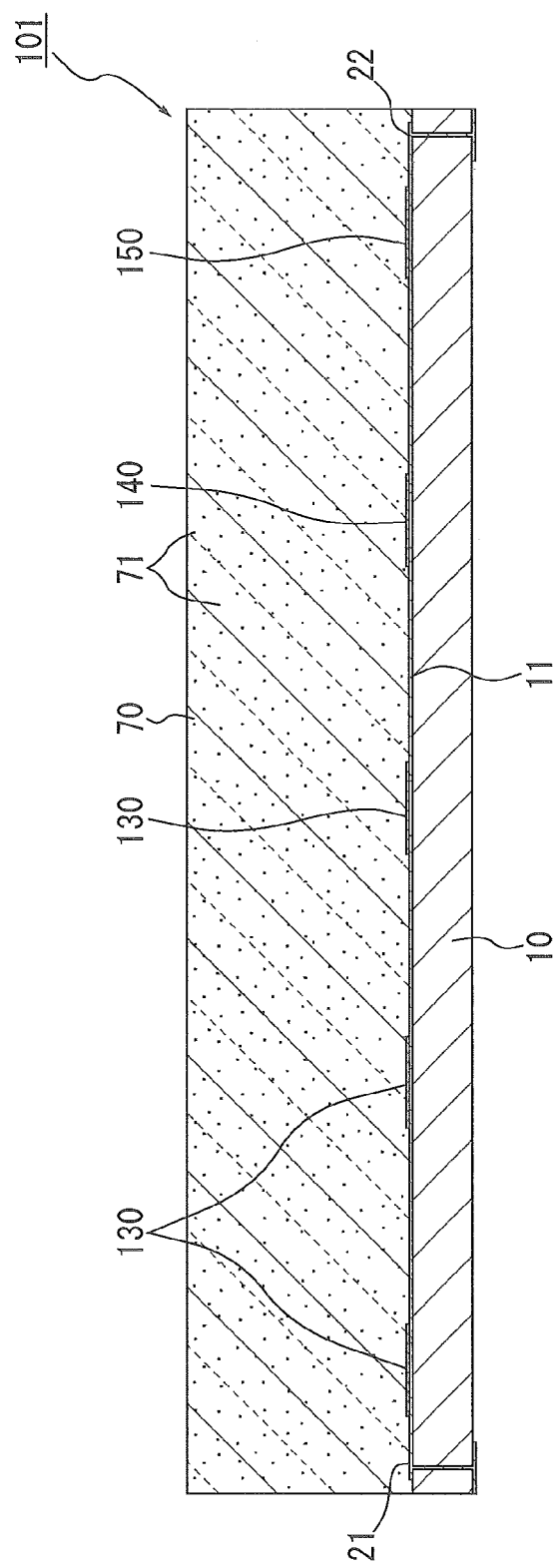
FIG. 13 is a cross sectional view of the package substrate.

FIG. 13 is a cross sectional view of the package substrate. Next, as shown in FIG. 13, the semiconductor light emitting part 132 on the package substrate body 10 is sealed by the sealing resin 70. A transparent resin such as an epoxy-based resin or a silicone-based resin can be used as the sealing resin 70. In the sealing resin 70, the phosphors 71 are contained, which emit yellow light if exited by blue light emitted from each of the light emitting parts 132. As the phosphors 71 which emit yellow light, YAG-based (Yttrium-Aluminum-Garnet-based) phosphors or silicate-based phosphors can be used.

A completed package substrate 1 is attached to the supporting part 5, and is connected with terminal part 4 by the inside conducting wire 6. Then, by assembling the case 2 to the terminal part 4, the light emitting device 7 is completed.

As described above, according to the method for manufacturing the light emitting device of this embodiment, a plurality of LED elements 130, 140, 150 are mounted on the package substrate body 10 using a flip-chip technique in the mounting step, and each of the LED elements 130, 140, 150 is electrically connected with the package substrate body 10. Next, the growth substrate 131 is removed in the removing step, and the semiconductor light emitting parts 132, 142, 152 remain on the package substrate body 10. Conventionally, unless a semiconductor layer is thickened to a thickness capable of being handled (for example 50 μm), it was not possible to arrange only the semiconductor light emitting parts 132, 142, 152 on the package substrate body 10. However, by performing lift-off and etching for the growth substrates 131, 141, 151 on the package substrate body 10, it has become possible to form the semiconductor light emitting parts 132, 142, 152 on the package substrate body 10.

In this way, since only the semiconductor light emitting parts 132, 142, 152 remain on the package substrate body 10, there is no deterioration in optical and thermal performance originating in the growth substrates 131, 141, 151. Moreover, since the growth substrates 131, 141, 151 are removed after each of the LED elements 130, 140, 150 is mounted, thin semiconductor light emitting parts 132, 142, 152 shown in FIG. 12 can be formed on the package substrate body 10, as is clearly seen if compared to the package substrate 1 shown in FIG. 3.

Moreover, since the LED elements 130, 140, 150 which meet the expected performance can be selected in advance in the selecting step before use, yield can be improved. That is, it is less likely that an element with initial failure is included, unlike a conventional case where pasting to a sub-mount or an AlN substrate is performed at once with a plurality of semiconductor element structures being formed on growth substrates. Moreover, neither pasting to another substrate like a supporting substrate etc. nor peeling the supporting substrate etc. on a package substrate is required.

Moreover, since what is necessary is just to irradiate the laser beam on each of the LED elements 130, 140 individually in the case of lift-off, it can be suppressed that distribution arises in the peeling of the growth substrates 131, 141, if compared to a conventional method where line scans are performed for an entire wafer with elements not being separated or where laser irradiation is performed on each area of a scribe line corresponding to an element, thereby also improving yield. Particularly, in this embodiment, since the growth substrates 131, 141 are removed by the laser beam with a spot diameter larger than the LED elements 130, 140, the beam can be uniformly irradiated on each of the LED elements 130, 140, which can properly suppress the distribution arising in the peeling of the growth substrates 131, 141, enabling improved yield steadily. Usually, laser lift-off is performed on each wafer in which a plurality of LED elements are adjacent one another. Laser lift-off cannot be performed for each element, even if performing laser irradiation is tried for each element, because adjacent LED elements are also affected. However, by cutting out each LED element once from a wafer as in this embodiment, it becomes possible to irradiate a laser beam on each LED element which is in a completely independent state.

Moreover, according to the light emitting device of this embodiment, since the growth substrates 131, 141, 151 do not exist on the semiconductor light emitting parts 132, 142, 152, or the growth substrates 131, 141, 151 are quite thin if they exist, the semiconductor light emitting parts 132, 142, 152 can be shaped thinner, which can quickly radiate heat generated from the light emitting parts 132, 142, 152 to the side of the package substrate body 10. That is, by reducing heat transfer from the light emitting parts 132, 142, 152, through the growth substrates 131, 141, 151, to the sealing resin 70, the phosphors 71, etc., it is possible to suppress the degradation of the sealing resin 70, the phosphors 71, etc.

In the blue LED element 130 and the green LED element 140 having the growth substrates 131, 141 and the semiconductor light emitting parts 132, 142, respectively, which are different from each other in material, since the growth substrates 131, 141 do not exist, light does not reflect at the interface between the semiconductor light emitting parts 132, 142 and the growth substrates 131, 141, thereby improving the efficiency of light extraction from the semiconductor light emitting parts 132, 142. When the light emitting device of this embodiment was actually produced, the efficiency of light emission can be improved roughly by 10 to 30%, as compared to a device having the growth substrates 131, 141.

Figure 14:
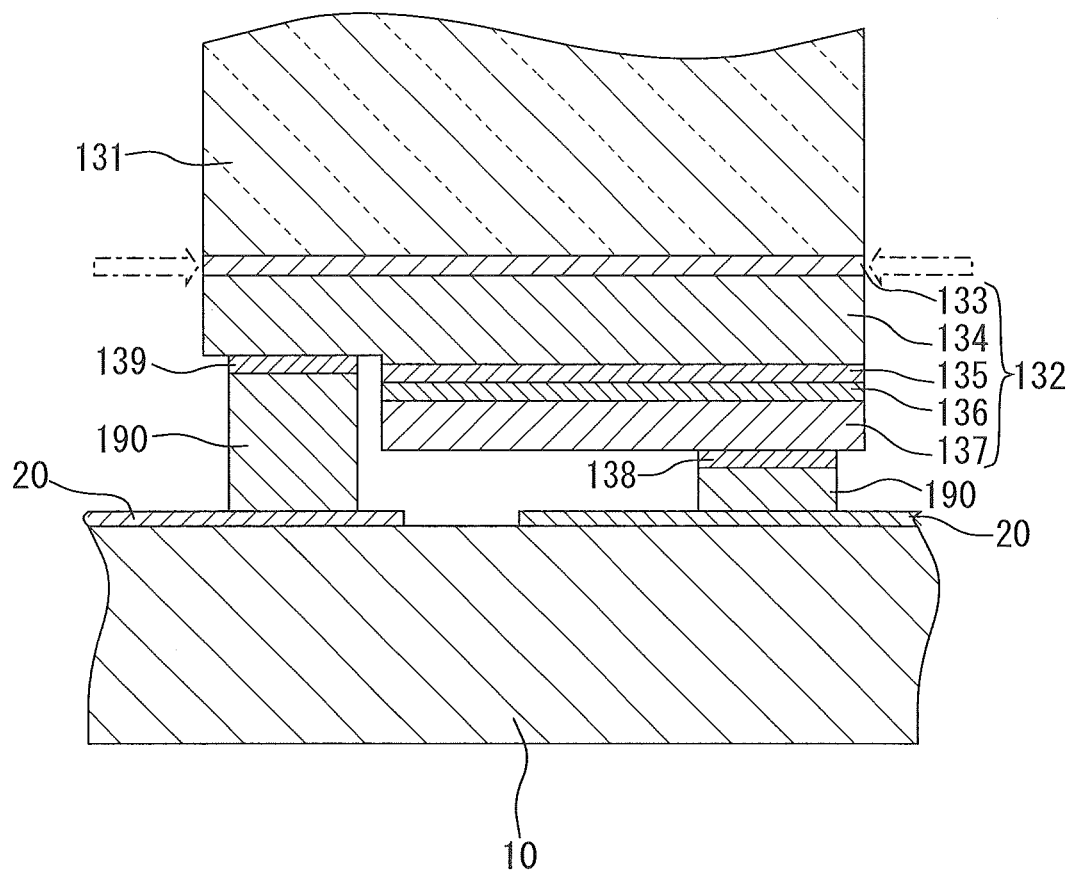
FIG. 14 shows a variation, and is an explanatory view showing a state where the growth substrate is being separated by chemical etching.

In the above embodiment, with regard to the blue LED element 130 and the green LED element 140, although an example was shown where the growth substrates 131, 141 were removed by irradiating the laser beam at the interface between the semiconductor light emitting parts 132, 142 and the growth substrates 131, 141, the growth substrates 131, 141 may be removed by etching, for example. In this case, the growth substrate 131, 141 can be removed by etching the growth substrates 131, 141 themselves or by etching a sacrificial layer formed between the growth substrates 131, 141 and the active layer. For example, in the case of the blue LED element 130 of the second embodiment, the growth substrates 131, 141 can be separated by etching the buffer layer 133 as the sacrificial layer. As shown in FIG. 14, the buffer layer 133 is to be chemically etched little by little from an exposed side face toward the inner direction. Thereby, as shown in FIG. 15, the semiconductor light emitting part 132, where the buffer layer 133 and the growth substrate 131 have been removed, can be formed on the package substrate body 10.

Although the embodiments of the present invention have been described, the embodiments described above do not limit the invention according to the claims. It should be noted that all the combinations of the features described in the embodiments are not necessarily essential to the solution to the problem of the invention.

REFERENCE SIGN LIST

1 Package body
7 Light emitting device
10 Package substrate body
20 Circuit pattern
21 Anode electrode
22 Cathode electrode
23 Series connecting part
24 Parallel connecting part
30 Blue LED element
40 Green LED element
50 Red LED element
60 Wire
70 Sealing resin
71 Yellow phosphors
101 Light emitting device
120 Circuit pattern
121 Anode electrode
122 Cathode electrode
123 Series connecting part
124 Parallel connecting part
130 Blue LED element
131 Growth substrate
132 Semiconductor light emitting part
133 Buffer layer
134 N-type GaN layer
135 Active layer
136 Light guide layer
137 P-type GaN layer
138 P-side electrode
139 N-side electrode
140 Green LED element
141 Growth substrate
142 Semiconductor light emitting part
150 Red LED element
151 Growth substrate
152 Semiconductor light emitting part
190 Solder

The invention claimed is:

1. A light emitting device comprising:
a chip-on-board type package substrate on which a plurality of light emitting diode (LED) elements are directly mounted;
a circuit pattern formed on the package substrate, the circuit pattern including:
a plurality of mounting parts, on which the plurality of LED elements are electrically connected;
a plurality of series of connecting parts to arrange the plurality of LED elements in series connection;
a parallel connecting part to connect both ends of each series connecting parts with a pair of an anode electrode and a cathode electrode which supply current to the plurality of LED elements,
wherein each LED element electrically connected to the circuit pattern includes plural kinds of LED elements which are different from one another in light emission wavelength and in temperature characteristics,
wherein by using the temperature characteristics of the plural kinds of LED elements, an average color rendering index (Ra) as a whole device is configured to become within a range of 95 to 98 at an operating temperature of 80° C. than the Ra in a range of 78 to 82 at an ordinary temperature of 20° C.,
wherein a ratio of light emission intensity in a peak wavelength of a blue LED element and of a red LED element of the plural kinds of LED elements is in a range from 1:4 to 1:6 at an ordinary temperature and is in a range from 1:2.5 to 1:3.5 at an operating temperature, and
wherein the plural kinds of LED elements include the blue LED element, a green LED element and the red LED element.

2. The light emitting device according to claim 1,
wherein a power attenuation factor of the blue LED element is 8 to 20% from the ordinary temperature to the operating temperature.
wherein a power attenuation factor of the green LED element is 10 to 40% from the ordinary temperature to the operating temperature, and
wherein a power attenuation factor of the red LED element is 10 to 60% from the ordinary temperature to the operating temperature.

3. The light emitting device according to claim 2, further including yellow phosphors which emit yellow light if exited by the blue LED element.

4. The light emitting device according to claim 1, wherein the plural kinds of LED elements includes:
green phosphors which emit green light if exited by the blue LED element or the red LED element: and
yellow phosphors which emit yellow light if exited by the blue LED element or the red LED element.

* * * * *